United States Patent
Liu et al.

(10) Patent No.: US 7,012,334 B2
(45) Date of Patent: Mar. 14, 2006

(54) SEMICONDUCTOR CHIP WITH BUMPS AND METHOD FOR MANUFACTURING THE SAME

(75) Inventors: Chih Chiang Liu, Kaohsiung (TW); Chi Cheng Pan, Kaohsiung (TW); Kuo Lung Wang, Kaohsiung (TW); Che Hsiung Chen, Kaohsiung (TW)

(73) Assignee: Advanced Semiconductor Engineering, Inc., (TW)

( * ) Notice: Subject to any disclaimer, the term of this patent is extended or adjusted under 35 U.S.C. 154(b) by 7 days.

(21) Appl. No.: 10/901,335

(22) Filed: Jul. 29, 2004

(65) Prior Publication Data

US 2005/0035451 A1  Feb. 17, 2005

(30) Foreign Application Priority Data

Aug. 14, 2003 (TW) .............................. 92122396 A

(51) Int. Cl.
*H01L 23/48* (2006.01)

(52) U.S. Cl. ................. 257/737; 257/738; 228/180.22; 438/613; 438/614

(58) Field of Classification Search ................ 257/737, 257/738; 438/613, 614; 228/180.22
See application file for complete search history.

(56) References Cited

U.S. PATENT DOCUMENTS 6,756,671 B1 * 6/2004 Lee et al. .................... 257/737
6,805,279 B1 * 10/2004 Lee et al. .................... 228/220

* cited by examiner

*Primary Examiner*—Sara Crane

(57) ABSTRACT

A method for manufacturing a semiconductor chip with bumps comprises providing a semiconductor chip, which defines an active surface and a back surface and has a plurality of pads disposed on the active surface, and a plurality of preformed solder balls. A passivation is disposed on the active surface of the semiconductor chip with the pads exposed. A plurality of UBMs (Under Bump Metallurgy) are disposed on the pads and define a plurality of bump pads. The diameter of the bump pads is about 100% to about 130% of the diameter of the preformed solder balls. The preformed solder balls are placed on the bump pads and then reflowed to form a plurality of bumps on the semiconductor chip.

15 Claims, 3 Drawing Sheets

SEMICONDUCTOR CHIP WITH BUMPS AND METHOD FOR MANUFACTURING THE SAME

RELATED APPLICATIONS

The present application is based on, and claims priority from, Taiwan, R.O.C. Application Serial Number 092122396, filed Aug. 14, 2003, the disclosure of which is hereby incorporated by reference herein in its entirety.

BACKGROUND OF THE INVENTION

1. Field of the Invention

The present invention relates to a semiconductor chip with bumps, and more particularly to a semiconductor chip having a large solder ball wetting area so as to form the bumps of which the height is lower.

2. Description of the Related Art

As electronic devices have become smaller and thinner, the speed and the complexity of IC chip become more and more higher. Accordingly, a need has arisen for higher packaging efficiency. Demand for miniaturization is the primary catalyst driving the usage of advanced packages such as chip scale packages (CSP) and flip chips. Both of them greatly increase the packaging efficiency and reduce the amount of board real estate required when compared with the alternative ball grid array (BGA) and thin small outline package (TSOP).

The flip chip package itself also has to be miniaturized in dimensions. Specifically, not only the length and the width but also the thickness of the flip chip package has to be reduced. Referring to FIGS. 1 and 2, they depict the ball mounting process of a conventional semiconductor flip chip 18. The semiconductor chip 18 has a plurality of pads, which are typically aluminum pads 20. A passivation layer 16 is coated on the active surface of the semiconductor chip 18 with the aluminum pads 20 exposed. A repassivation layer 14, for example, which is made of BCB (benzocyclobutene), is coated on the passivation layer 16 with the aluminum pads 20 exposed. A plurality of UBMs (Under Bump Metallurgy) 22 are disposed on the exposed aluminum pads 20 for defining a plurality of bump pads. A plurality of preformed solder balls 12 are placed on the UBMs 22, i.e. the bump pads, and then reflowed to form a plurality of bumps 13. The process which uses the preformed solder balls 12 placed on the UBM 22 and reflowed to form the bumps 13 is generally referred to as a ball mounting process or a ball mount process.

Furthermore, it will be apparent to those skilled in the art that a redistribution process for the semiconductor flip chip can be carried out if the aluminum pads of the semiconductor flip chip are not positioned in place. In this case, the UBMs are formed on the repassivation layer and are electrically connected to the aluminum pads for forming a plurality of redistribution traces and a plurality of bump pads at other positions. Generally, another repassivation layer, for example, made of BCB (benzocyclobutene), is provided to cover the redistribution traces with the bump pads exposed.

In the prior art, the diameter w of the opening of the bump pads is about 80% to about 90% of the diameter d of the preformed solder balls, and the height h of the formed bumps is about 80% to about 85% of the diameter d of the preformed solder balls. If the height of the bumps has to be reduced, the small preformed solder balls will be required. However, as the size of the solder ball is reduced, the ball mounting process becomes more difficult and the cost also be increased.

Furthermore, in the prior art, the bump of which the height is less than 160 μm is generally formed by a standard flip chip process, including printing or plating solder paste and reflowing the solder paste. The bump which is made by the ball mounting process is generally larger than 240 μm in height. In fact, in the prior art, there is no suitable processes for forming the bumps which is 160 μm to 240 μm in height.

Accordingly, there exists a need for a semiconductor flip chip with the bumps which are made by a ball mounting process and are low in height.

SUMMARY OF THE INVENTION

It is an object of the present invention to provide a semiconductor flip chip with bumps which are low in height and are formed by a ball mounting process.

In order to achieve the above object, the present invention provides a method for manufacturing a semiconductor chip with bumps. The method comprises providing a semiconductor chip which defines an active surface and a back surface and has a plurality of pads disposed on the active surface, and a plurality of preformed solder balls. A passivation is disposed on the active surface of the semiconductor chip with the pads exposed. A plurality of UBMs (Under Bump Metallurgy) are disposed on the pads and define a plurality of bump pads. The diameter of the bump pads is about 100% to about 130% of the diameter of the preformed solder balls. The preformed solder balls are placed on the bump pads and then reflowed to form a plurality of bumps As described hereinabove, the semiconductor flip chip according to the present invention has a large pad opening to provide a large solder ball wetting area so as to decrease the height of the bumps. The semiconductor flip chip according to the present invention use the comparatively large preformed solder balls in dimensions without increasing the cost and the difficulty of the ball mounting process.

BRIEF DESCRIPTION OF THE DRAWINGS

Other objects, advantages, and novel features of the invention will become more apparent from the following detailed description when taken in conjunction with the accompanying drawing.

DESCRIPTION OF THE PREFERRED EMBODIMENT

Figure 1:
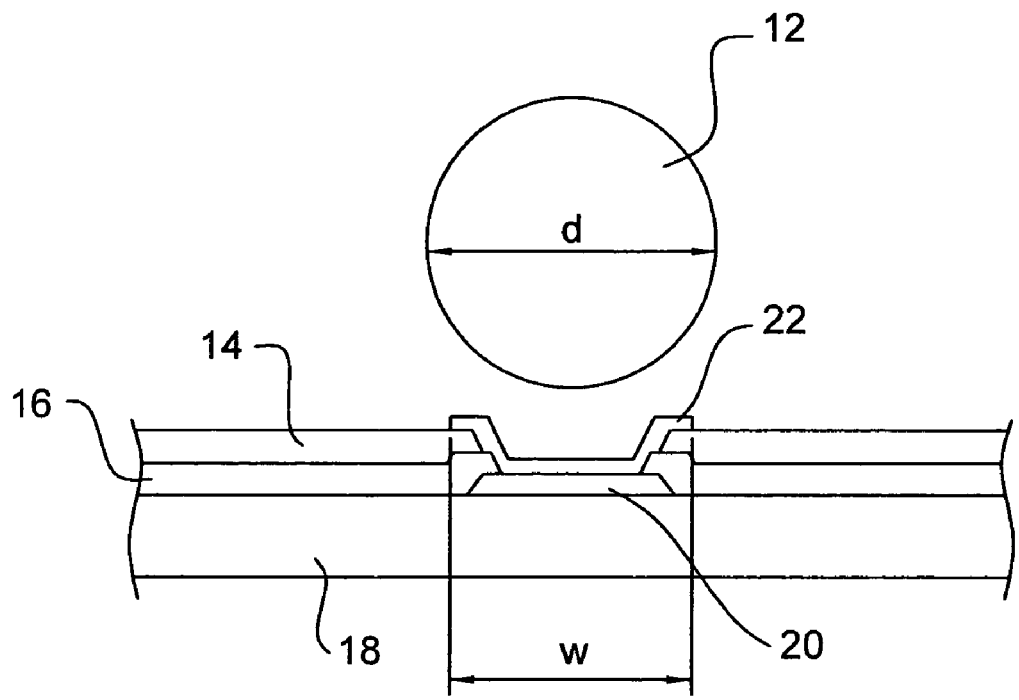
FIG. 1 is a schematic cross-sectional view showing a ball mounting process of a semiconductor chip in the prior art.
Figure 2:
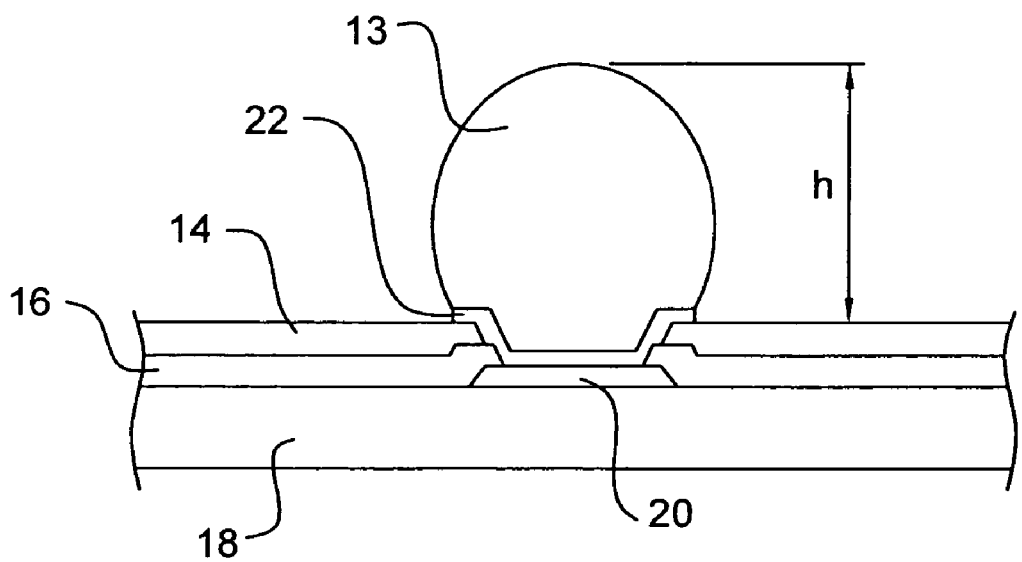
FIG. 2 is a schematic cross-sectional view of a semiconductor chip with bumps in the prior art.
Figure 3:
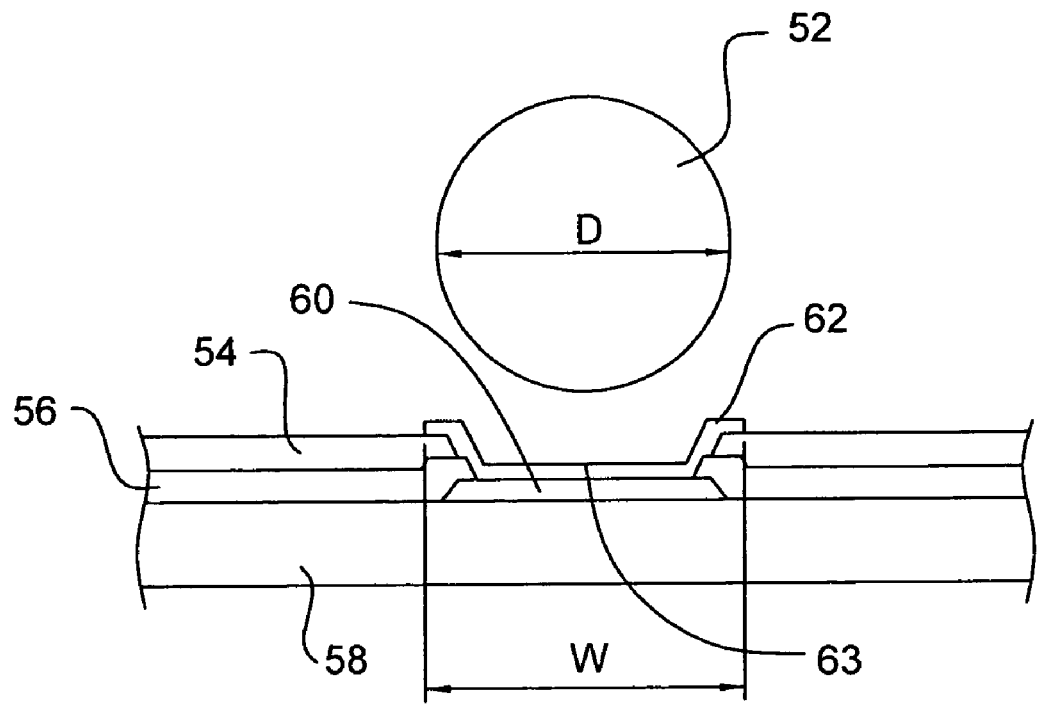
FIG. 3 is a schematic cross-sectional view showing a ball mounting process of a semiconductor chip with bumps according to an embodiment of the present invention.
Figure 4:
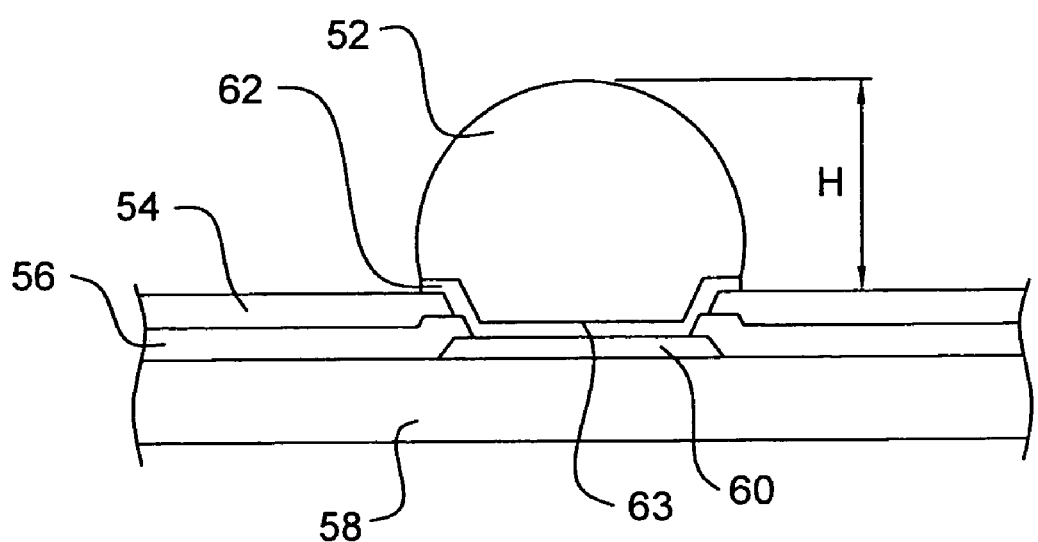
FIG. 4 is a schematic cross-sectional view of a semiconductor chip with bumps according to an embodiment of the present invention.

Referring to FIGS. 3 and 4, they depict a ball mounting process for a semiconductor flip chip 58 according to an embodiment of the present invention. The semiconductor chip 58 has an active surface and a back surface, and is provides with a plurality of pads, such as aluminum pads 60, disposed on the active surface. A passivation layer 56 is disposed on the active surface of the semiconductor chip 58 with the aluminum pads 60 exposed. A repassivation layer 54, for example, such as made of BCB (benzocyclobutene), is disposed on the passivation layer 56 with the aluminum pads 60 exposed. A plurality of UBMs (Under Bump Metallurgy) 62 are disposed on the exposed aluminum pads 60 and define a plurality of bump pads 63.

A plurality of preformed solder balls 52 are placed on the UBMs 62, i.e. the bump pads 63, and then reflowed to form a plurality of bumps 53. Each of the bump pads 63 defines a pad opening, i.e. the recess area of the UBM 62. Compared with the prior art, the diameter W of the pad openings of the bump pads 63 according to the present invention is larger. The diameter W of the pad openings according to the present invention is about 100% to about 130% of the diameter D of the preformed solder balls 52. The height H of the bumps 53 is about 55% to about 65% of the diameter D of the preformed solder balls 52. In other words, the diameter W of the pad openings is about 155% to 235% of the height H of the bump 53.

The semiconductor flip chip 58 according to the present invention has large pad openings and thus has large solder ball wetting areas such that the height of the bumps is decreased. The preformed solder balls 52 used in the semiconductor flip chip 58 has the same size as the conventional semiconductor flip chip has, and the height of the bumps 53 of the semiconductor flip chip 58 is lower than that of the conventional semiconductor flip chip. In addition, the bump pads 63 can be formed directly with a large size. Alternatively, the size of the bump pads 63 is not changed and the repassivation layer 54 covers less area of the bump pads 63 to increase the contact area between the bump pads 63 and the preformed solder balls 52, i.e. the solder ball wetting area, without decreasing the distance between the bump pads 63. Therefore, the height H of the bumps 53 after reflowed is about 55% to 65% of the diameter D of the preformed solder ball 52.

Figure 5:
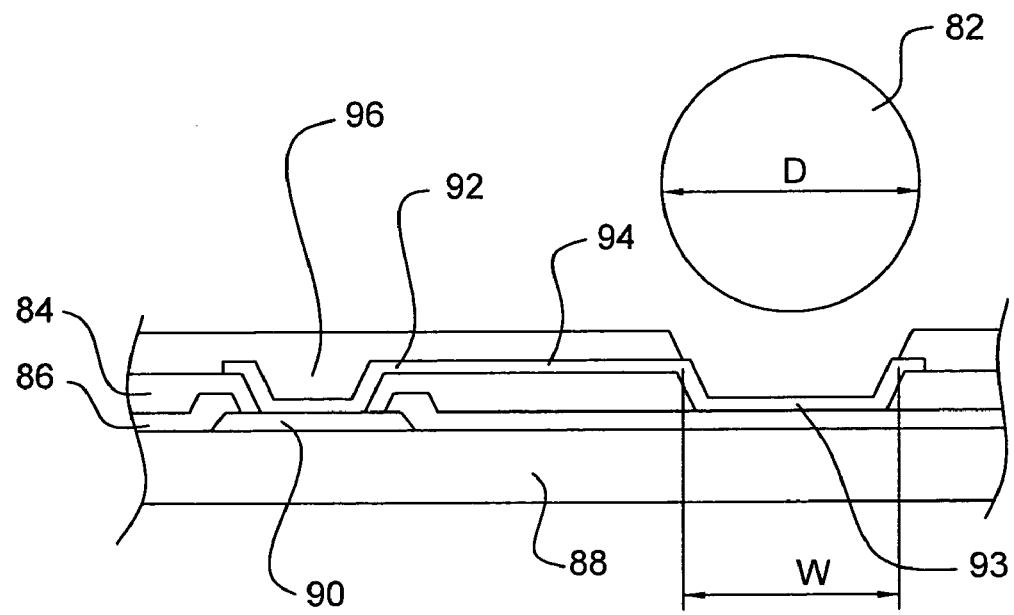
FIG. 5 is a schematic cross-sectional view showing a ball mounting process of the semiconductor chip with bumps according to another embodiment of the present invention.
Figure 6:
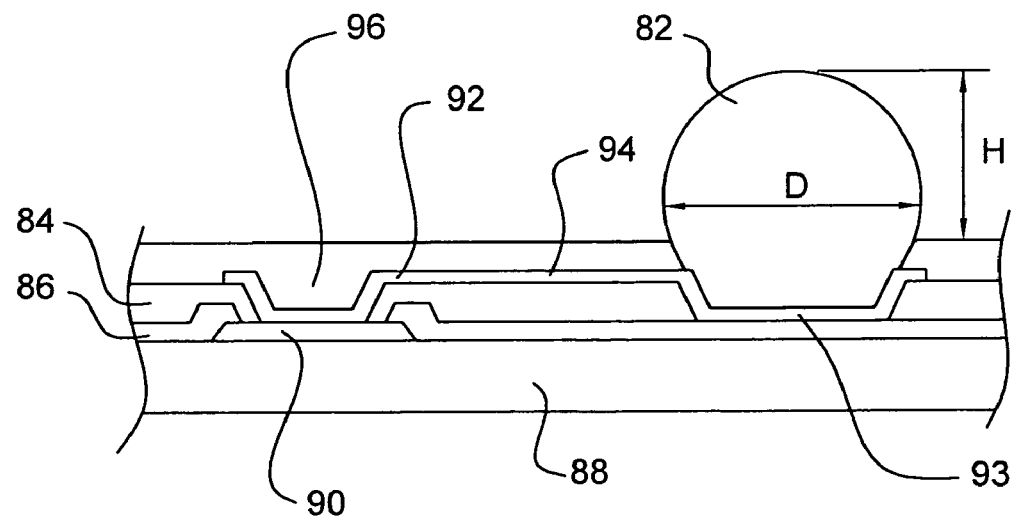
FIG. 6 is a schematic cross-sectional view of a semiconductor chip with bumps according to another embodiment of the present invention.

Referring to FIGS. 5 and 6, they depict a ball mounting process of a semiconductor flip chip 88 according to another embodiment of the present invention. The semiconductor chip 88 has an active surface and a back surface, and comprises a plurality of pads, such as aluminum pads 90, which are disposed on the active surface. A passivation layer 86 covers the active surface of the semiconductor chip 88 with the aluminum pads 90 exposed. A first repassivation layer 84, for example, made of BCB (benzocyclobutene), covers the passivation layer 86 with the aluminum pads 90 exposed.

A plurality of redistribution traces 92 are disposed on the first repassivation layer 84 and connected to the aluminum pads 90 and the recess of the first repassivation layer 84. In other words, the redistribution trace 92 extends from the aluminum pad 90 the recess of the first repassivation layer 84 so as to define a bump pad 93 on the recess of the first repassivation layer 84 and form a trace 94 between the aluminum pads 90 and the bump pad 93. A second repassivation layer 96, for example, made of BCB (benzocyclobutene), is disposed on the redistribution traces 92 with the bump pads 93 exposed. The process which is used for forming bump pads 93 on some position other than the aluminum pads 90 is generally referred to as a redistribution process.

A plurality of preformed solder balls 82 are placed on the bump pads 93 and then reflowerd to form a plurality of bumps 83. Each of the bump pads 93 defines a pad opening. Compared with the prior art, the diameter W of the pad openings of the bump pads 93 is larger. The diameter W of the pad openings according to the present invention is about 100% to about 130% of the diameter D of the preformed solder balls 82. The height H of the bump 83 is about 55% to about 65% of the diameter D of the preformed solder balls 82.

In addition, the bump pads 93 can be formed directly with a large size. Alternatively, the size of the bump pads 93 is not changed and the second repassivation layer 96 covers less area of the bump pads 93 to increase the contact area between the bump pads 93 and the preformed solder balls 82, i.e. the solder ball wetting area, without decreasing the distance between the bump pads 93. Therefore, the height H of the bumps 83 after reflowed is about 55% to 65% of the diameter D of the preformed solder balls 82.

As described hereinabove, the semiconductor flip chip according to the present invention has a large pad opening to provide a large solder ball wetting area so as to decrease the height of the bumps. The semiconductor flip chip according to the present invention use the preformed solder balls which are comparatively larger in dimensions but the cost and the difficulty of the ball mounting process are not increased. Further, in the subsequent packaging process, the bump which is low in height provides a high ball shear strength so as to increase the strength of the package with the semiconductor flip chip according to the present invention.

Furthermore, the semiconductor flip chip according to the present invention can use the preformed solder balls which is about 300 $\mu$m to about 500 $\mu$m in diameter so as to form the bumps which is about 160 $\mu$m to about 320 $\mu$m in height.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A method for manufacturing a semiconductor chip with bumps comprising the following steps of:
   providing a semiconductor chip defining an active surface and a back surface and having a plurality of pads disposed on the active surface;
   providing a plurality of preformed solder balls;
   disposing a passivation layer on the active surface of the semiconductor chip with the pads exposed;
   disposing a plurality of UBMs (Under Bump Metallurgy) on the pads and defining a plurality of bump pads, wherein the diameter of the bump pads is about 100% to about 130% of the diameter of the preformed solder balls;

placing the preformed solder balls on the bump pads; and reflowing the preformed solder balls to form a plurality of bumps.

2. The method according to claim 1, wherein the height of the bump is about 55% to 65% of the diameter of the preformed solder ball.

3. The method according to claim 1, further comprising the following step of:

disposing a repassivation layer on the passivation layer with the pads exposed.

4. The method according to claim 1, wherein the height of the bump is about 160 μm to about 320 μm.

5. The method according to claim 1, wherein the diameter of the preformed solder balls is about 300 μm to about 500 μm.

6. A method for manufacturing a semiconductor chip with bumps comprising the following steps of:

providing a semiconductor chip defining an active surface and a back surface and having a plurality of pads disposed on the active surface;

providing a plurality of preformed solder balls;

disposing a passivation layer on the active surface of the semiconductor chip with the pads exposed;

disposing a first repassivation layer on the passivation layer with the pads exposed;

forming a plurality of redistribution traces on the first repassivation layer and electrically connected to the pads;

disposed a second repassivation layer on the redistribution traces with a part of the redistribution trace exposed for defining a plurality of bump pads, wherein the diameter of the bump pads is about 100% to about 130% of the diameter of the preformed solder balls;

placing the preformed solder balls on the bump pads; and reflowing the preformed solder balls to form a plurality of bumps.

7. The method according to claim 6, wherein the height of the bumps is about 160 μm to about 320 μm.

8. The method according to claim 6, wherein the diameter of the preformed solder balls is about 300 μm to about 500 μm.

9. A semiconductor chip with bumps comprising:

a semiconductor chip body defining an active surface and a back surface, and having a plurality of pads disposed on the active surface;

a passivation disposed on the active surface of the semiconductor chip body with the pads exposed;

a plurality of UBMs (Under Bump Metallurgy) electrically connected to the pads and defining a plurality of bump pads; and a plurality of bumps disposed on the bump pads, wherein the diameter of the bump pad is about 155% to 235% of the height of the bump.

10. The semiconductor chip with bumps according to claim 9, further comprising:

a plurality of redistribution traces for electrically connecting the pads to the bump pads.

11. The semiconductor chip with bumps according to claim 10, further comprising:

a first repassivation layer disposed on the passivation layer with the pads exposed.

12. The semiconductor chip with bumps according to claim 11, further comprising:

a second repassivation layer disposed on the redistribution traces.

13. The semiconductor chip with bumps according to claim 9, further comprising:

a repassivation layer disposed on the passivation layer with the pads exposed.

14. The semiconductor chip with bumps according to claim 9, wherein the height of the bumps is about 160 μm to about 320 μm.

15. The semiconductor chip with bumps according to claim 9, wherein the diameter of the preformed solder balls is about 300 μm to about 500 μm.

* * * * *